United States Patent
Zhang et al.

(10) Patent No.: US 12,433,026 B2
(45) Date of Patent: Sep. 30, 2025

(54) DISPLAY PANEL AND DISPLAY DEVICE

(71) Applicants: MIANYANG HKC OPTOELECTRONICS TECHNOLOGY CO.,LTD, Mianyang (CN); HKC CORPORATION LIMITED, Shenzhen (CN)

(72) Inventors: Jianying Zhang, Mianyang (CN); Limiao Wang, Mianyang (CN); Rong Tang, Mianyang (CN); Jie Wang, Mianyang (CN); Baohong Kang, Mianyang (CN)

(73) Assignees: MIANYANG HKC OPTOELECTRONICS TECHNOLOGY CO., LTD, Mianyang (CN); HKC CORPORATION LIMITED, Shenzhen (CN)

( * ) Notice: Subject to any disclaimer, the term of this patent is extended or adjusted under 35 U.S.C. 154(b) by 90 days.

(21) Appl. No.: 17/911,661

(22) PCT Filed: Dec. 31, 2021

(86) PCT No.: PCT/CN2021/143543
§ 371 (c)(1),
(2) Date: Sep. 15, 2022

(87) PCT Pub. No.: WO2022/222543
PCT Pub. Date: Oct. 27, 2022

(65) Prior Publication Data
US 2024/0222382 A1   Jul. 4, 2024

(30) Foreign Application Priority Data

Apr. 20, 2021 (CN) .......... 202110423359.X (51) Int. Cl.
H10D 86/60 (2025.01)
H10D 86/40 (2025.01)

(52) U.S. Cl.
CPC .......... *H10D 86/60* (2025.01); *H10D 86/441* (2025.01)

(58) Field of Classification Search
CPC ...... H10D 86/60; H10D 86/441; H10H 29/49; H10H 29/8508; G02F 1/1339;
(Continued)

(56) References Cited

U.S. PATENT DOCUMENTS

2006/0022201 A1   2/2006   Kim et al.
2008/0137021 A1*  6/2008   Choi ................... G02F 1/1345
                                                         349/150
(Continued)

FOREIGN PATENT DOCUMENTS

CN   102314027 A   1/2012
CN   202916560 U   5/2013
(Continued)

OTHER PUBLICATIONS

Li, Xueying, the ISA written comments, Mar. 2022, CN.
(Continued)

*Primary Examiner* — Natalia A Gondarenko (57) ABSTRACT

A display panel and a display device are disclosed. A sealant is arranged between a first substrate and a second substrate, and is arranged in a non-display area. A first metal wire group and a second metal wire group are connected in one-to-one correspondence through a set of bridging structures. In the set of bridging structure, the bridging structure closest to the outer edge of the sealant is the outermost bridging structure, and the distance between the outermost bridging structure and the outer edge of the sealant is at least 50 um.

14 Claims, 5 Drawing Sheets

(58) Field of Classification Search
CPC ......... G02F 1/136204; G02F 1/136286; G02F 1/13629; G02F 1/133331; G02F 1/133334; G02F 1/133514; G02F 1/1336; H10K 59/131; H10K 59/80516; H10K 59/80522; H10K 59/82; H10K 59/873; H10K 50/16; H10K 50/80; H10K 50/805; H10K 50/813; H10K 50/814; H10K 50/82; H10K 50/822; H10K 50/824; H10K 50/8426; H10K 50/88; H10K 50/81; H10K 50/84; H10K 50/844; H10K 71/00; H10K 59/1275; H10K 59/122; H10K 59/123; H10K 59/124; H10K 59/126; H10K 59/127; H10K 59/173; H10K 59/80; H10K 59/805; H10K 59/8051; H10K 59/8052; H10K 59/80521; H10K 59/87; H10K 59/8721; H10K 59/8723; H10K 59/80515
USPC .............................................. 349/149; 257/59
See application file for complete search history.

(56) References Cited

U.S. PATENT DOCUMENTS

| 2016/0070127 | A1* | 3/2016 | Ishikawa | G02F 1/1368 349/42 |
|---|---|---|---|---|
| 2016/0293688 | A1 | 10/2016 | Chen et al. | |
| 2016/0349565 | A1* | 12/2016 | Kim | H10K 59/131 |
| 2018/0143478 | A1 | 5/2018 | Kim et al. | |
| 2018/0203318 | A1 | 7/2018 | Abe et al. | |
| 2019/0198598 | A1* | 6/2019 | Lee | G09G 3/3614 |
| 2021/0088861 | A1* | 3/2021 | Hsieh | G02F 1/136204 |
| 2021/0376038 | A1* | 12/2021 | Won | H10K 59/1213 |
| 2022/0013622 | A1* | 1/2022 | Choi | H10K 59/8722 |
| 2022/0068211 | A1* | 3/2022 | Jeong | H10K 59/123 |

FOREIGN PATENT DOCUMENTS

| CN | 103293807 | A | 9/2013 |
|---|---|---|---|
| CN | 107315294 | A | 11/2017 |
| CN | 108919579 | A | 11/2018 |
| CN | 109065549 | A | 12/2018 |
| CN | 110058465 | A | 7/2019 |
| CN | 110965071 | A | 4/2020 |
| CN | 113219736 | A | 8/2021 |
| CN | 113219738 | A | 8/2021 |
| CN | 113219739 | A | 8/2021 |
| CN | 113219740 | A | 8/2021 |
| CN | 113219741 | A | 8/2021 |
| CN | 113359359 | A | 9/2021 |
| KR | 20060010117 | A | 2/2006 |
| WO | WO2013080734 | A1 | 6/2013 |

OTHER PUBLICATIONS

Li, Xueying, the International Search Report, Mar. 2022, CN.
Indian Patent Office Examination Report for 202217064199.
Xueying Li, the International Searching Authority written comments, Mar. 2022, CN.
Xueying Li, the International Search Report, Mar. 2022, CN.

* cited by examiner

DISPLAY PANEL AND DISPLAY DEVICE

CROSS-REFERENCE TO RELATED APPLICATIONS

This application is a United States national stage application of co-pending International Patent Application Number PCTCN2021/143543, filed Dec. 31, 2021, which claims the benefit and priority of Chinese patent application number CN202110423359X, entitled "Display Panel and Display Device" and filed with China National Intellectual Property Administration on Apr. 20, 2021, the entire contents of which are incorporated herein by reference.

TECHNICAL FIELD

This application relates to the field of display technology, and more particularly relates to a display panel and a display device.

BACKGROUND

The statements herein are intended for the mere purpose of providing background information related to the present application and do not necessarily constitute prior art.

A display panel typically includes an array substrate and a color filter substrate. The array substrate and the color filter substrate are sealed by a sealant and bonded to form the display panel. Since the inside of the box is sealed, it is difficult to be corroded by water vapor, but the wirings formed outside the sealant may be corroded by water vapor.

The array substrate typically adopts the design of bridging structures to realize the electrode connection between different metal layers, and so it is needed to form multiple bridging structures on the array substrate. Some of the bridging structures are located outside the sealant and are easily corroded by water vapor. There are also some bridging structures that are located under the sealant, and because the sealant needs adhesion, a waterproof layer cannot be disposed under the sealant. Therefore, the bridging structures under the sealant can be easily corroded by the entry of moisture.

SUMMARY

It is therefore a purpose of the present application to provide a display panel and a display device, which can improve the corrosion resistance of the bridging structures disposed in the non-display area of the display panel.

The present application discloses a display panel, which is divided into a display area and a non-display area. The display panel includes a first substrate and a second substrate opposite to the first substrate. A sealant is arranged between the first substrate and the second substrate, and the sealant is arranged in the non-display area. The first substrate includes a first metal layer, a second metal layer and a conductive layer which are arranged in sequence corresponding to the non-display area. The first metal layer and the second metal layer are insulated from each other, and the second metal layer and the conductive layer are insulated from each other. In the first metal layer is formed a first metal wire group, and in the second metal layer is formed a second metal wire group. The first metal wire group includes at least one sub-wire, and the second metal wire group includes at least one sub-connection wire. The sub-wires of the first metal wire group and the sub-connection wires of the second metal wire group are connected in a one-to-one correspondence through a set of bridging structures, where the set of bridging structures includes at least one bridging structure. The side of the sealant close to the display area is an inside of the sealant, and the side of the sealant away from the display area is an outside of the sealant. All the bridging structures are arranged in the direction of the outer edge of the sealant facing the display area. In a group of the bridging structures, the bridging structure closest to the outer edge of the sealant is the outermost bridging structure, and the distance between the outermost bridging structure and the outer edge of the sealant is at least 50 um.

The present application further discloses a display panel, which is divided into a display area and a non-display area. The display panel includes an array substrate, and a color filter substrate opposite to the array substrate. A sealant is arranged between the array substrate and the color filter substrate, and the sealant is arranged in the non-display area. The array substrate includes a substrate, a first metal layer, a first insulating layer, a second metal layer, a second insulating layer, and a conductive layer that are stacked in sequence corresponding to the non-display area. Two adjacent edges of the first substrate extend along a first direction and a second direction respectively, where the first direction and the second direction are perpendicular to each other. The routing direction of the first metal wire group is parallel to the first direction, and the routing direction of the second metal wire group is parallel to the second direction.

In the first metal layer is formed n sub-wires, and in the second metal layer is formed n sub-connection wires and at least one branch wire. A group of bridging structures are disposed in one-to-one correspondence between the plurality of sub-wires and the plurality of sub-connection wires. The conductive layer connects the sub-wires and the sub-connection wires through the corresponding bridging structures. The bridging structure is arranged on the sub-wire.

Of the n sub-wires, the sub-wire closest to the outer edge of the sealant is the first sub-wire, and in the direction of nearing the display area from the outside of the sealant, the order in which the sub-wires are arranged are sequentially the first sub-wire, the second sub-wire, . . . , and the n-th sub-wire. Of the n sub-connection wires, the ones that are connected to the first sub-wire, the second sub-wire, . . . , and the n-th sub-wire are respectively the first sub-connection wire, the second sub-connection wire, and the n-th sub-connection wire. The bridging structure connecting the first sub-wire and the first sub-connection wire is the first bridging structure, followed by the second bridging structure, . . . , and the n-th bridging structure.

The branch wire includes a first branch wire and a second branch wire. The first branch wire includes a first horizontal branch wire parallel to the first direction and a first vertical branch wire parallel to the second direction, wherein the first horizontal branch wire and the first vertical branch wire are connected to each other. The second branch wire includes a second horizontal branch wire parallel to the first direction. The first horizontal branch wire is perpendicular to the first vertical branch wire, and the first horizontal branch wire is parallel to the second horizontal branch wire. The first bridging structure is arranged on the first vertical branch wire, and the first bridging structure connects the first vertical branch wire with the first sub-wire. The first vertical branch wire is sequentially connected to the first horizontal branch wire with the first sub-connection wire. The second bridging structure is arranged on the second horizontal branch Wire, and the second bridging structure connects the second horizontal branch wire and the second sub-wire. The second horizontal branch wire is connected to the second sub-connection wire.

The sealant is in the shape of an annular square or rectangle, and is divided into a linear area and a corner area. The linear area includes a first linear area parallel to the first direction and a second linear area parallel to the second direction. The first linear area and the second linear area are connected by a corner area. The sealant in each of the first linear area and the second linear area is a linear segment, and the sealant in the corner area is a curved segment.

The junction of the first horizontal branch wire and the first sub-connection wire is disposed under the sealant in the corner area, and the distance between the junction and the outer edge of the sealant is less than 60 um. The junction of the second horizontal branch wire and the second sub-connection wire is disposed under the sealant in the corner area, and the distance from the junction of the second horizontal branch wire and the second sub-connection wire to the outer edge of the sealant is less than 60 um. The first bridging structure is disposed under the sealant of the linear area. The distance between each of all bridging structures and the outer edge of the sealant is at least 60 um.

The present application further discloses a display device, comprising a display panel and a backlight module configured for providing a light source for the display panel,
the display panel includes:
a first substrate, and
a second substrate corresponding to the first substrate;
a sealant, which is arranged between the first substrate and the second substrate, and the sealant is arranged in the non-display area;
the first substrate includes a first metal layer and a second metal layer that are arranged in sequence corresponding to the non-display area, and the first metal layer and the second metal layer are insulated from each other;
in the first metal layer is formed a first metal wire group, and in the second metal layer is formed a second metal wire group; the first metal wire group includes at least one sub-wire, and the second metal wire group includes at least one sub-connection wire; the sub-wires of the first metal wire group and the sub-connection wires of the second metal wire group are connected in one-to-one correspondence through a set of bridging structures, and the set of bridging structures includes at least one bridging structure;
the side of the sealant adjacent to the display area is the inside of the sealant, and the side of the sealant away from the display area is the outside of the sealant;
all the bridging structures are arranged on the side of the outer edge of the sealant nearer to the display area;
of the group of bridging structures, the bridging structure closest to the outer edge of the sealant is the outermost bridging structure, and the distance between the outermost bridging structure and the outer edge of the sealant is at least 50 um.

Compared with the exemplary solution of arranging a protective layer on the via hole, the present application moves the bridging structure of the non-display area to the inside of the sealant, and at least 50 um from the outer edge of the sealant to prevent water vapor from corroding from the edge of the sealant to the bridging structure. Not only can the process of manufacturing the protective layer be saved, but also the bridging structure can be protected from being corroded by external water vapor.

BRIEF DESCRIPTION OF DRAWINGS

The accompanying drawings, which are included to provide a further understanding of the embodiments of the present application, constitute a part of the specification, are used to illustrate the embodiments of the present application, and together with the written description, serve to explain the principles of the present application. Obviously, the drawings used in the following description merely depict some embodiments of the present application, and for those having ordinary skill in the art, other drawings can also be obtained from these drawings without investing creative effort. In the drawings.

DETAILED DESCRIPTION OF EMBODIMENTS

It should be understood that the terminology used herein, the specific structural and functional details disclosed are intended for the mere purpose of describing specific embodiments and are representative, but the present application may be embodied in many alternative forms and should not be construed as limited only the embodiments set forth herein.

In the description of this application, the terms "first" and "second" are merely used for description purposes, and cannot be understood as indicating relative importance, or implicitly indicating the number of indicated technical features. Thus, unless otherwise specified, features defined as "first" and "second" may expressly or implicitly include one or more of the features; "plurality" means two or more. The terms "including", "comprising", and any variations thereof are intended to mean a non-exclusive inclusion, namely one or more other features, integers, steps, operations, units, components and/or combinations thereof may be present or added.

In addition, terms such as "center", "transverse", "lateral". "above", "on", "under", "below", "left", "right", "vertical", "horizontal", "top" "bottom", "inside", "outside", etc., indicative of orientations or positional relationships are described based on the orientations or relative positional relationships illustrated in the drawings, and are intended for the mere purpose of convenience of simplified description of the present application, rather than indicating that the device or element referred to must have a specific orientation or be constructed, and operate in a particular orientation. Thus, these terms should not be construed as limiting the present application.

In addition, unless otherwise expressly specified and defined, terms "installed on", "connected to", and "coupled to" should be understood in a broad sense. For example, it may be a fixed connection, a detachable connection, or an integral connection; it may be a mechanical connection, or may also be an electrical connection; it may be a direct connection, an indirect connection through an intermediate medium, or an internal connection between two components. For those having ordinary skill in the art, the specific meanings of the above terms in this application can be understood depending on specific contexts.

The present application will be described in detail below with reference to the accompanying drawings and optional embodiments.

Figure 1:
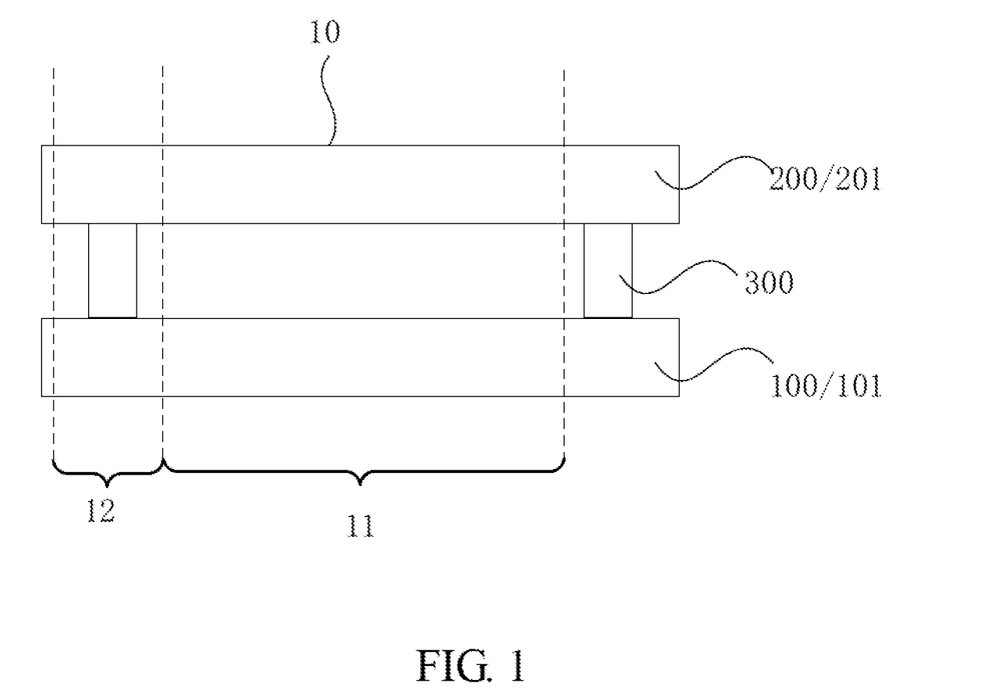
FIG. 1 is a schematic diagram of a display panel according to an embodiment of the present application.

FIG. 1 discloses a display panel 10. The display panel 10 includes a first substrate 100 and a second substrate 200 aligned and bonded together to form a cell. The first substrate 100 is divided into a display area 11 and a non-display area 12. A sealant 300 is disposed between the first substrate 100 and the second substrate 200, and the sealant 300 is disposed in the non-display area 12.

Figure 2:
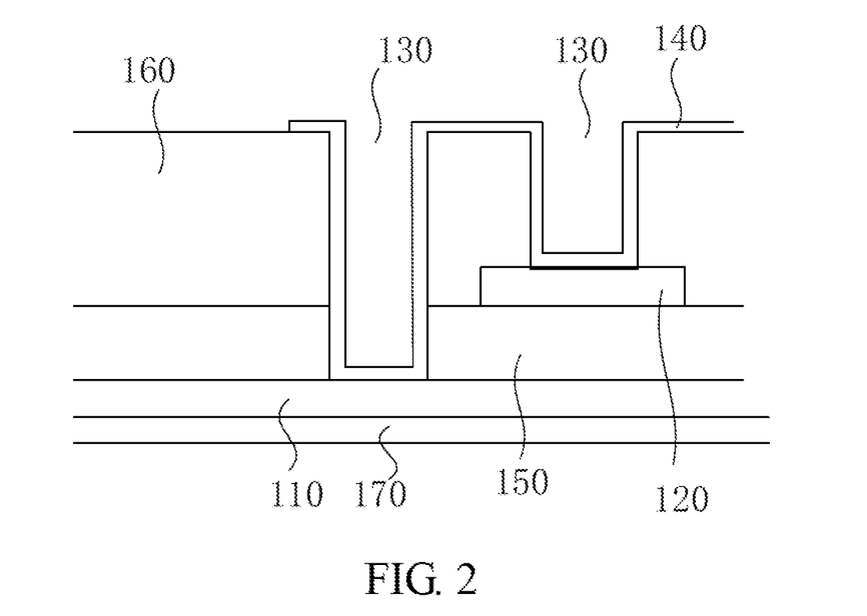
FIG. 2 is a schematic diagram of a first substrate according to an embodiment of the present application.

FIG. 2 discloses a schematic diagram of the first substrate 100. The array substrate 101 includes a substrate 170, a first metal layer 110, a first insulating layer 150, a second metal layer 120, a second insulating layer 160, and a conductive layer 140 which are stacked in sequence corresponding to the non-display area 12.

Specifically, it is shown that the first metal wire group 111 and the second metal wire group 121 are connected through the bridging structure 130 and the conductive layer 140. The first substrate 100 includes a first metal layer 110 and a second metal layer 120 disposed corresponding to the non-display area 12, where the first metal layer 110 and the second metal layer 120 are insulated from each other. In the first metal layer 110 is formed a first metal wire group 111, and in the second metal layer 120 is formed a second metal wire group 121. The first metal wire group 111 and the second metal wire group 121 are connected in a one-to-one correspondence through a set of bridging structures 130. The first metal layer 110 and the second metal layer 120 in the present application belong to the same layer as the first metal layer 110 and the second metal layer 120 in the display area 11 of the display panel 10. The first substrate 100 in this application is an array substrate 101, and the second substrate 200 is a color filter substrate 201. It should be noted that the first metal wire group 111 in the present application, that is, the sub-wires 112 are the peripheral traces of the non-display area 12, and provide driving signal voltages (e.g., VGH, VGL, CLK, VCOM, etc.) for the display panel 10). The second metal trace group 121 of the present application, that is, the sub-connection wires 122 are electrostatic discharge traces (ESD traces), which transfer the static electricity of the peripheral traces in the non-display area 12 to the outside of the display panel 10 through the bridging structure 130 to avoid the failure of the peripheral traces of the non-display area 12 due to ESD.

Figure 3:
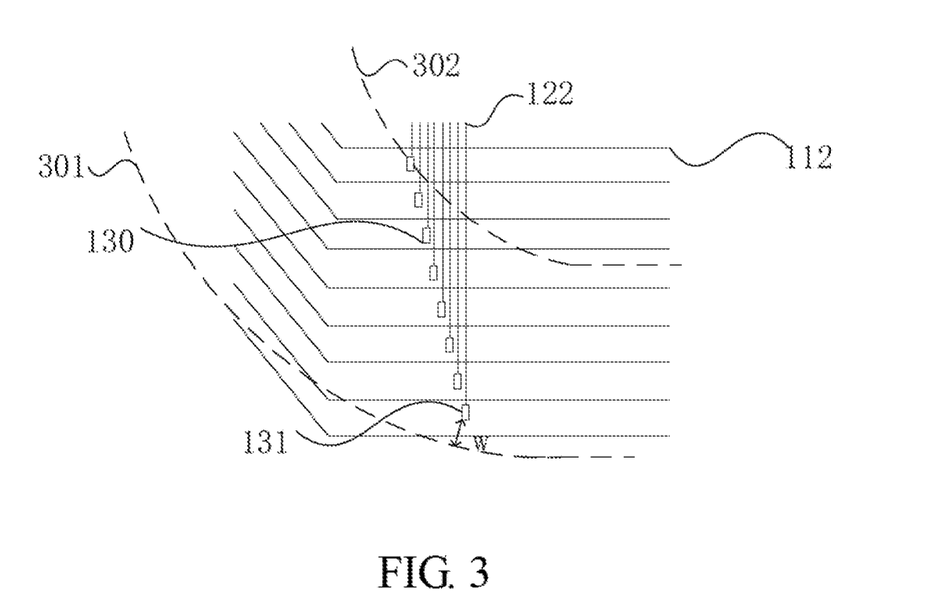
FIG. 3 is a schematic diagram illustrating the positions of a bridging structure and a sealant according to an embodiment of the present application.

FIG. 3 shows a schematic diagram of the positions of the bridging structure 130 and the sealant 300. The side of the sealant 300 adjacent to the display area 11 is the inside of the sealant 302, and the side of the sealant 300 away from the display area 11 is the outside of the sealant 301. All the bridging structures 130 are disposed in the direction of the outer edge 301 of the sealant facing the display area 11. In the group of the bridging structures 130, the bridging structure 130 closest to the outer edge 301 of the sealant is the outermost bridging structure 131, and the distance between the outermost bridging structure 131 and the outer edge 301 of the sealant is at least 50 um.

The inventor of the present application found that the bridging structure 130 of the non-display area 12 is easily corroded by external water vapor due to its proximity to the outside of the display panel 10, thereby causing problems such as disconnection. Compared with the exemplary solution of arranging a protective layer on the via hole, the present application moves the bridging structure 130 of the non-display area 12 to the inside of the sealant 300, and at least 50 um from the outer edge of the sealant 301 to prevent water vapor from corroding from the edge of the sealant 300 to the bridging structure 130. Not only can the process of manufacturing the protective layer be saved, but also the bridging structure 130 can be protected from being corroded by external water vapor, thereby improving the corrosion resistance of the display panel 10 and improving the service life of the display panel 10.

Figure 4:
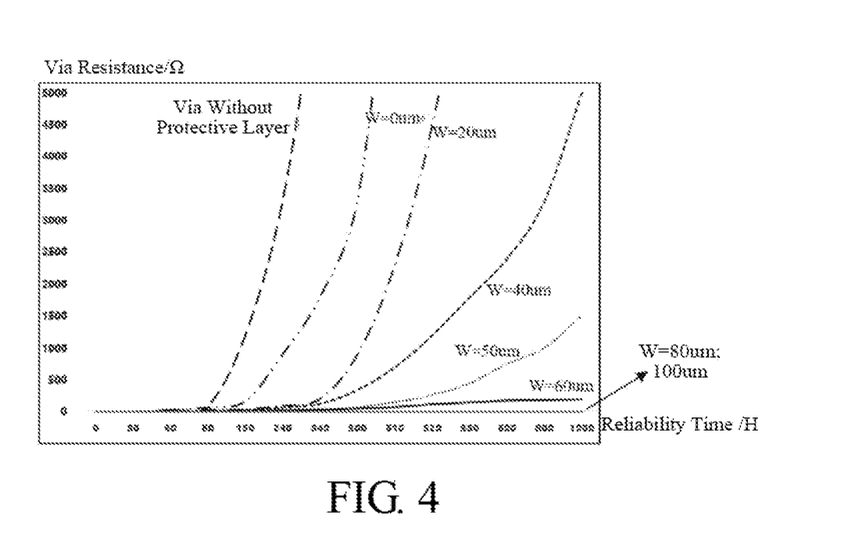
FIG. 4 is a schematic diagram of a graph showing the change in corrosion degree as a function of time under different distances between the outermost bridging structure and the outer edge of the sealant according to another embodiment of the present application.

FIG. 4 shows a graph illustrating the change of the corrosion degree as a function of time under different distances between the outermost bridging structure 131 and the edge of the sealant outer 301. In the figure, w refers to the length of the outermost bridging structure 131 from the edge of the sealant outside 301, the abscissa in the figure is the reliability time (the unit is hour), and the ordinate is the resistance value of the outermost bridging structure 131. Since the phenomenon after the bridging structure 130 is corroded is that the resistance increases, the ordinate in this figure is the resistance value of die outermost bridging structure 131 to indicate the degree of corrosion. In connection with Table 1, Table 1 corresponds to the values of each point of the curve in FIG. 1, indicating the specific values of the abscissa and ordinate. The experimental conditions in FIG. 1 and Table 1 are: in a reliable environment of 85 degrees Celsius and 85% humidity. Table 1 is as follows: It should be noted that other variables are controlled in this application to be consistent, such as the aperture size and other factors as the default aperture, so that the distance W in this experiment is the single variable.

TABLE 1

| W value | RA time | | | | | | | |
|---|---|---|---|---|---|---|---|---|
| | 0 H | 30 H | 60 H | 80 H | 150 H | 240 H | 340 H | 500 H |
| Via without protective layer | 1.2Ω | 2.5Ω | 40Ω | 100Ω | 1.21KΩ | 3.3KΩ | 6.9KΩ | 10KΩ |
| 0 um | 1.2Ω | 1.9Ω | 32Ω | 71Ω | 169Ω | 0.96KΩ | 1.8KΩ | 3.3KΩ |
| 20 um | 1.2Ω | 1.5Ω | 13.8Ω | 37.7Ω | 44.3Ω | 104Ω | 210Ω | 0.92KΩ |

TABLE 1-continued

| | | | | | | | | |
|---|---|---|---|---|---|---|---|---|
| 40 um | 1.2Ω | 1.5Ω | 2.5Ω | 19.6Ω | 33Ω | 76Ω | 130Ω | 350Ω |
| 50 um | 1.2Ω | 1.4Ω | 1.8Ω | 15.5Ω | 28Ω | 39Ω | 56Ω | 75Ω |
| 60 um | 1.2Ω | 1.4Ω | 1.6Ω | 10.8Ω | 22Ω | 26Ω | 35Ω | 55Ω |
| 80 um | 1.2Ω | 1.2Ω | 1.2Ω | 1.2Ω | 1.2Ω | 1.2Ω | 1.2Ω | 1.2Ω |
| 100 um | 1.2Ω | 1.2Ω | 1.2Ω | 1.2Ω | 1.2Ω | 1.2Ω | 1.2Ω | 1.2Ω |

| | RA time | | | | | |
|---|---|---|---|---|---|---|
| W value | 510 H | 520 H | 530 H | 600 H | 800 H | 1000 H |
| Via without protective layer | 25KΩ | 0.31MΩ | 1.21MΩ | 30MΩ | 500MΩ | >500MΩ |
| 0 um | 7.9K | 12KΩ | 75KΩ | 0.15MΩ | 0.68MΩ | 4.51MΩ |
| 20 um | 2.31KΩ | 4.52KΩ | 8.12KΩ | 19.11KΩ | 0.34MΩ | 2.96MΩ |
| 40 um | 0.75KΩ | 1.22KΩ | 1.81KΩ | 2.44KΩ | 3.38KΩ | 5.11KΩ |
| 50 um | 0.16KΩ | 0.27KΩ | 0.45KΩ | 0.75KΩ | 1.22KΩ | 1.51KΩ |
| 60 um | 78Ω | 123Ω | 150Ω | 178Ω | 186Ω | 200Ω |
| 80 um | 1.2Ω | 1.2Ω | 1.3Ω | 1.3Ω | 1.3Ω | 1.3Ω |
| 100 um | 1.2Ω | 1.2Ω | 1.2Ω | 1.2Ω | 1.2Ω | 1.2Ω |

It can be seen from Table 1 that when w=0 um, the resistance of the outermost bridging structure 131 changes from 1.2Ω to 1.9Ω during the period from 0 hours to 30 hours, and during die period from 30 hours to 60 hours, the resistance of the outermost bridging structure 131 has abruptly changed from 1.9 ohms to 32 ohms. It can be seen that in the second 30-hour change, the resistance of the outermost bridging structure 131 has increased to 16 times, and in the process from 60 hours to 80 hours, the resistance of the outermost bridging structure 131 has reached 71 ohm, so that at the time of 500 hours, the resistance of the outermost bridging structure 131 has risen to 3.3KΩ, indicating that the resistance of the first bridging structure 130 changes greatly. At 500 hours, the outermost bridging structure 131 is completely corroded. Similarly, in the cases of w=20 um and 40 um, the resistance of the outermost bridging structure 131 reaches more than 1 kilo ohm in the time of 500 hours in each case, indicating that the resistance of the first bridging structure 130 changes greatly. It shows that in cases where the w is small, the outermost bridging structure 131 can be easily corroded.

Taking w=50 um as an example, in the process from 0 hours to 500 hours, the resistance value of the outermost bridging structure 131 only increases from 1.2 ohms to 75 ohms. When the experimental conditions are converted into the temperature and humidity of the normal environment, the experimental data of 500 hours can be converted into a service life of at least 5 years. Thus, a 5-year warranty can be achieved, and it is closer to the outer edge 301 of the sealant, which makes the internal wiring space larger and the external space narrower, which is suitable for the display panel 10 with a narrow bezel.

In Table 1 above, when w=50 um, in the period of 500 hours to 1000 hours, the resistance value of the outermost bridging structure 131 increases from 75 ohms to 1.51KΩ, indicating that the resistance of the first bridging structure 130 still changes greatly. It can be seen that in the case of w=50 um, the outermost bridging structure 131 still has a certain risk of being corroded. Although the corrosion risk can be resisted for a certain period of time, a very low corrosion risk value cannot be achieved, and the resistance of the outermost bridging structure 131 will still rise to a significantly large value within a long enough period of time.

Taking w=60 um as an example, in the process of 0 hours to 500 hours, the resistance value of the outermost bridging structure 131 only increases from 1.2 ohms to 55 ohms, and in the process of 500 hours to 1000 hours, the resistance of the outermost bridging structure 131 value rises from 55 ohms to 200 ohms. It can be seen that, in the change curve from 1 hour to 1000 hours, the slope value of the curve changes little, indicating that the resistance of the first bridging structure 130 changes little, and it is further shown that in the case of w=60 um, the risk of corrosion of the outermost bridging structure 131 is extremely small. Even for a long enough period of time, the resistance value of the outermost bridging structure 131 does not rise to a high level, which has the effect of preventing corrosion of the outermost bridging structure 131.

In the case of w=80 or 100, the resistance value of the outermost bridging structure 131 only changes from 1.2 ohms to 1.3 ohms during the experiment from 0 hours to 1000 hours, meaning it is hardly changed, indicating that in the case of w≥80 um, the outermost bridging structure 131 is basically not corroded, which greatly ensures the service life of some display panels 10 that need to operate in high humidity and high temperature conditions.

It can be seen from the experimental data that the larger the value of w is, the farther the outermost bridging structure 131 is from the outer edge 301 of the sealant, that is, the closer the outermost bridging structure 131 is to the display area 11, and the corrosion resistance is significantly improved. However, due to the limited wiring space of the display panel 10, the value of w cannot be infinitely large. Generally, the width of the sealant 300 is in the range of 500 um-1500 um. When the value of w is less than 300 um, the internal wiring space meet the requirements, and the wiring spaces of the display area 11 and the area where the edge of the inner side 302 of the sealant faces the display area 11 will not be compromised. Therefore, in the case where the distance between the outermost bridging structure 131 and the outer edge 301 of the sealant is 60-300 um in the present application, the display panel 10 can have better anti-corrosion ability under high humidity and high temperature conditions, can be used for a long time and has a long service life. For a narrow bezel display panel 10 with a narrow bezel 300, for example, the width of the sealant 300 is 200 um-500 um, when the value of w is less than 200 um, it can ensure that other bridging structures 130 have a certain space for arrangement.

Specifically, the outermost bridging structure 131 is connected to the sub-wire 112 closest to the outer side 301 of the sealant, and the distance between the sub-wire 112 closest to the outer side 301 of the sealant and the outer edge 301 of the sealant is greater than 60 um. By ensuring that the distance between the oftenest sub-wire 112 and the outer edge 301 of the sealant is greater than 60 um, the distance between the outermost bridging structure 131 at the corresponding sub-connection wire 122 and the outer edge 301 of the sealant can be greater than 60 um.

However, due to the influence of other wirings at the side of the outer edge 301 of the sealant facing the display area 11, the first metal wire group 111 and the second metal wire group 121 cannot be arranged in an area closer to the display area 11. They can only be arranged near the edge of the first substrate 100. Furthermore, on the basis of pursuing a narrow-bezel display panel 10, the distance of the sealant 300 from the first substrate 100 is even shorter, so that the wiring area of the non-display area 12 is narrower, and the distance of the outermost bridging structure 131 from the outer edge 301 of the sealant cannot be designed to be at least 60 um.

Figure 5:
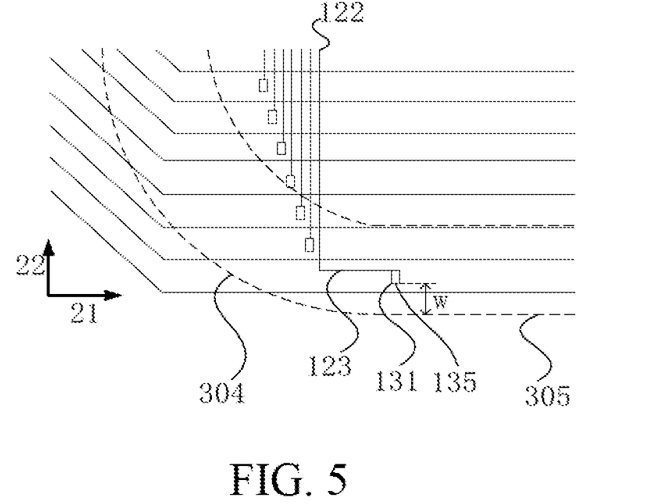
FIG. 5 is a schematic diagram illustrating the positions of a bridging structure and a sealant according to another embodiment of the present application.

In connection with FIGS. 1, 2 and 5, as another embodiment of the present application, the present application discloses another first substrate 100. The first substrate 100 is divided into a display area 11 and a non-display area 12. The non-display area 12 of the first substrate 100 includes a substrate 170, a first metal layer 110, a first insulating layer 150, a second metal layer 120, a second insulating layer 160, a conductive layer 140, and a sealant 300, which are sequentially stacked. A first metal wire group 111 is formed in the first metal layer 110, and a second metal wire group 121 is formed in the second metal layer 120. The first metal wire group 111 and the second metal wire group 121 are connected in a one-to-one correspondence through a set of bridging structures 130. In FIG. 5, two adjacent edges of the first substrate extend along the first direction 21 and the second direction 22 respectively. That is, the first substrate 100 includes the two sides arranged horizontally in the direction of the first direction 21, and two sides arranged vertically in the direction of the second direction 22, wherein the first direction 21 is perpendicular to the second direction 22. The routing direction of the first metal wire group 111 is parallel to the first direction 21, and the routing direction of the second metal wire group 121 is parallel to the second direction 22. The side of the sealant 300 adjacent to the display area 11 is the edge of the inner side 302 of the sealant, and the side of the sealant 300 away from the display area 11 is the outer edge 301 of the sealant. All the bridging structures 130 are located on the side from the outer edge 301 of the sealant toward the display area 11. The first metal wire group 111 is located on the side of the outer side 301 of the sealant facing the display area 11, and the second metal wire group 121 is located on the side of the outer side 301 of the sealant facing the display area 11.

The first metal wire group 111 includes a plurality of sub-wires 112 arranged in parallel, and the second metal wire group 121 includes a plurality of sub-connection wires 122 and at least one branch wire 123 arranged in parallel. The set of bridging structures 130 includes at least one direct-connecting bridging structure 130 and at least one transition bridging structure 135. The direct-connecting bridging structure 130 is disposed on the sub-connection wire 122. The direct-connecting bridging structure 130 directly connects the sub-wire 112 and the sub-connection wire 122. The transition bridging structures 130 are arranged on the branch wires 123 in one-to-one correspondence. The transition bridging structure 135 connects the branch wire 123 and the sub-wire 112. The branch wire 123 is connected to the sub-connection wire 122. The number of the transition bridging structures 130 is equal to the number of the branch wires 123. The routing direction of the branch wire 123 and the routing direction of the sub-connection wire 122 are not in the same linear direction. The branch wire 123 and the sub-connection wire 122 are arranged on the same layer and are connected to each other. The distance between the direct-connecting bridging structure 130 and the outer edge 301 of the sealant is at least 60 um, and the distance between the transition bridging structure 135 and the outer edge 301 of the sealant is at least 60 um. The junction of the branch wire 123 and the sub-connection wire 122 is disposed under the sealant 300 of the corner area 305, and the distance from the junction of the branch wire 123 and the sub-connection wire 122 to the outer edge 301 of the sealant is less than 60 um.

Due to the close distance from the bridging structure 130 near the outer side 301 of the sealant to the outer edge 301 of the sealant, some bridging structures 130 cannot meet the condition that their distance from the outer edge 301 of the sealant reaches 60 um. In this solution, the position of the corresponding bridging structure 130 is changed by means of the branch wire 123, so that the distance between the corresponding bridging structure 130 and the outer edge 301 of the sealant reaches 60 um, which has a better anti-corrosion effect. It can be seen from FIG. 5 that if the solution does not use the branch wire 123 for transiting, then the distance between the outermost bridging structure 131 and the outer edge 301 of the sealant is difficult to achieve more than 60 um.

FIG. 5 is a schematic diagram of the bridging structures 130 and the corner area 305 of the sealant 300. The sealant 300 is in the shape of an annular square or rectangle, is arranged around the display area 11, and can be divided into a linear area 304 and a corner area 305. The linear area 304 includes a first linear area 304 parallel to the first direction 21 and a second linear area 304 parallel to the second direction 22. The first linear area 304 and the second linear area 304 are connected by a corner area 305. The sealant 300 in each of the first linear area 304 and the second linear area 304 is a linear segment, and the sealant 300 in the corner area 305 is a Curved segment. Some of the bridging structures 130 are located under the sealant 300 of the corner area 305. The junction of the branch wire 123 and the sub-connection wire 122 is located under the sealant 300 in the corner area 305, and the distance between the junction and the outer edge 301 of the sealant is less than 60 um.

Because the signal lines can be arranged along the edge corners at the corners of the display panel 10, where the angle at the corners can be relatively larger, even 90°. However, for the position of the sealant 300, due to the influence of the gluing process, the corner of the sealant 300 cannot be 90° but an arc. Therefore, the signal lines in the corner area 305 are relatively closer to the frame outside the sealant 301, and even beyond the coverage area of the sealant 300. When it again comes to the linear area 304, however, the signal lines return to the coverage area of the sealant 300 again. Therefore, the junction of the sub-wire 112 and the connecting wire may be located outside the sealant 300 or at the corner area 305 of the sealant 300, while the junction of the first sub-wire 112 on the outer side and the first sub-connection wire 122 may be located outside the sealant 300. However, by moving the transition bridging structure 135 moved toward the linear area 304 of the sealant 300 through the branch wire 123, the length of the transition bridging structure 135 from the outer edge 301 of the sealant can be made greater than 60 um.

Figure 6:
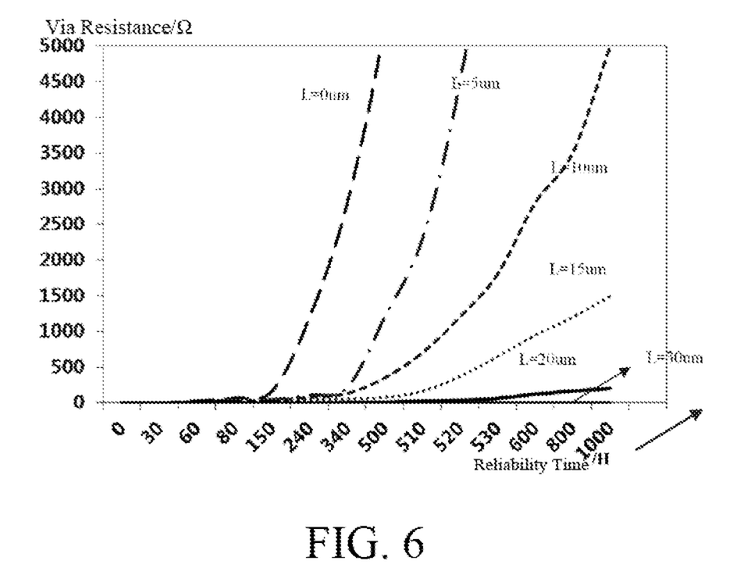
FIG. 6 is a schematic diagram of a graph showing the change in corrosion degree as a function time under different distances between the outermost bridging structure and the adjacent bridging structure according to another embodiment of the present application.

The bridging structure 130 that needs to use the branch wire 123 for transition is typically the bridging structure 130 corresponding to the sub-wire 112 closest to the outer edge 301 of the sealant, namely the outermost bridging structure 131 is the transition bridging structure 135. The sub-wire 112 closest to the outer edge 301 of the sealant is the first sub-wire 112; the distance between the transition bridging structure 135 and the adjacent bridging structure 130 is greater than 20 um. For example, FIG. 6 shows a schematic diagram of a curve where the abscissa is time, the ordinate is the resistance of the bridging structures 130 in cases of different distances between adjacent bridging structures 130, where the corrosion test conditions are: the temperature is 85 degrees Celsius, the humidity is 85%. From the curve in the figure, the closer the distance between the two bridging structures 130 is, when one bridging structure 130 is corroded, the resistance of the adjacent bridging structures 130 will become larger and larger in a certain period of tine, which indicates that the adjacent bridging structure 130 is corroded. That is, when a bridging structure 130 corrodes, it is easy to continue to deteriorate along the direction of the metal traces, destroying the adjacent bridging structures 130 and causing corrosion. Correspondingly, when the adjacent distance is 20 um or more, when one bridging structure 130 is corroded, the resistance of the adjacent bridging structure 130 changes little, indicating that when the adjacent bridging structure 130 is separated by 20 um, the adjacent bridging structure 130 is not easily affected and corroded. The specific data corresponding to the horizontal and vertical coordinates can be found in Table 2 below.

Figure 7:
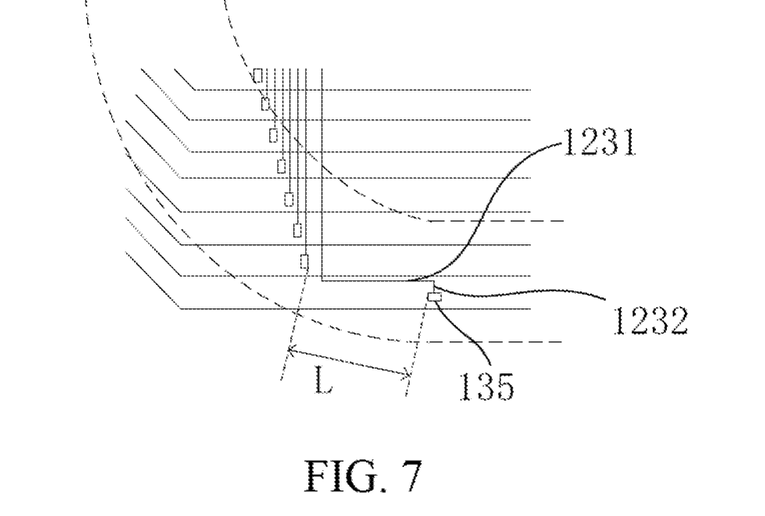
FIG. 7 is a schematic diagram illustrating the positions of a bridging structure and a sealant according to another embodiment of the present application.

As illustrated in FIG. 7, the first metal wire group 111 includes n parallel sub-wires 112, and the second metal wire group 121 includes n parallel sub-connection wires 122 and two branch wires 123.

Among the n sub-wires 112, the one closest to the outer edge 301 of the sealant is the first sub-wire 112, and in the order of nearing the display area 11 from the position closest to the outer edge 301 of the sealant, the sub-wires 112 are sequentially the first sub-wire, the second sub-wire, . . . and the n-th sub-wire. Among the n sub-connection wires, the ones connected to the first sub-wire, the second sub-wire, . . . , and the n-th sub-wire are respectively the first sub-connection wire, the second sub-connection wire . . . and the n-th sub-connection wire. The bridging structures connecting the first sub-wires and the first sub-connection wires are the first bridging structures, which in turn are the second bridging structure, . . . , and the n-th bridging structure. The first bridging structure and the second bridging structure are the transition bridging structures. The third bridging structure, the fourth bridging structure, . . . , and the n-th bridging structure are the direct-connecting bridging structures.

The corresponding branch wire 123 on which the first bridging structure 130 is disposed is the first branch wire 124, and the corresponding branch wire 123 on which the second bridging structure 130 is disposed is the second branch wire 125. The first branch wire 124 includes a first horizontal branch wire 1231 and a first vertical branch wire 1232, and the second branch wire 125 includes a second horizontal branch wire 1251. The first horizontal branch wire 1231 is perpendicular to the first vertical branch wire

TABLE 2

| L value | Time | | | | | | | | | | | | | |
|---|---|---|---|---|---|---|---|---|---|---|---|---|---|---|
| | 0 H | 30 H | 60 H | 80 H | 150 H | 240 H | 340 H | 500 H | 510 H | 520 H | 530 H | 600 H | 800 H | 1000 H |
| 0 um | 1.5Ω | 4.3Ω | 32Ω | 71Ω | 169Ω | 1.2KΩ | 2.8KΩ | 5.3KΩ | 8.9KΩ | 12KΩ | 75KΩ | 0.2MΩ | 2.8MΩ | 4.5MΩ |
| 5 um | 1.5Ω | 2.8Ω | 13.8Ω | 37.7Ω | 44.3Ω | 104Ω | 210Ω | 1.2KΩ | 2.3KΩ | 4.5KΩ | 8.0KΩ | 19KΩ | 0.8MΩ | 2.9MΩ |
| 10 um | 1.5Ω | 3.2Ω | 5.7Ω | 19.6Ω | 33Ω | 76Ω | 130Ω | 350Ω | 700Ω | 1.2Ω | 1.8KQ | 2.8KΩ | 3.5KΩ | 5.1KΩ |
| 15 um | 1.5Ω | 2.4Ω | 4.6Ω | 15.5Ω | 28Ω | 39Ω | 56Ω | 75Ω | 160Ω | 370Ω | 650Ω | 950Ω | 1.2KΩ | 1.5KΩ |
| 20 um | 1.5Ω | 1.5Ω | 1.5Ω | 1.5Ω | 1.5Ω | 1.5Ω | 5.5Ω | 8.6Ω | 24Ω | 35Ω | 62Ω | 124Ω | 168Ω | 199Ω |
| 30 um | 1.5Ω | 1.5Ω | 1.5Ω | 1.5Ω | 1.5Ω | 1.5Ω | 1.5Ω | 1.5Ω | 1.5Ω | 1.5Ω | 1.5Ω | 1.5Ω | 1.5Ω | 1.5Ω |

FIG. 6 shows another connection mode of the branch wire 123, where the branch wire 123 includes a first horizontal branch wire 1231 and a first vertical branch wire 1232 that are connected to each other. The first horizontal branch wire 1231 is perpendicular to the first vertical branch wire 1232. The transition bridging structure 135 is disposed on the first vertical branch wire 1232, and the transition bridging structure 135 connects the first vertical branch wire 1232 with the sub-connection wire 122. The first vertical branch wire 1232 is sequentially connected to the first horizontal branch wire 1231 and the sub-connection wire 122. The junction of the first horizontal branch wire 1231 and the sub-connection wire 122 is located under the sealant 300 in the corner area 305, and the distance between the junction and the outer edge 301 of the sealant is less than 60 um.

When the turning are of the sealant 300 in the corner area 305 has a small curvature, so that the distance from the edge of the sealant outside 301 needs to be made less than 60 um, the branch wire 123 is used to move it to the area that meets the 60 um requirement. The distance between the transition bridging structure 135 and the adjacent bridging structure 130 is greater than 20 um. Thus, the first vertical branch wire 1232 and the first horizontal branch wire 1231 cooperate with each other, so that the outermost bridging structure 131 can satisfy the above conditions of 60 um and 20 um.

1232. The first horizontal branch wire 1231 is parallel to the second horizontal branch wire 1251. The first bridging structure 130 is disposed on the first vertical branch wire 1232, and the first bridging structure 130 connects the first vertical branch wire 1232 with the first sub-wire 112. The first vertical branch wire 1232 is sequentially connected to the first horizontal branch wire 1231 with the first sub-connection wire 122. The second bridging structure 130 is disposed on the second horizontal branch wire 1251, and the second bridging structure 130 connects the second horizontal branch wire 1251 with the second sub-wire 112. The second horizontal branch wire 1251 is connected to the second sub-connection wire 122.

The junction of the first horizontal branch wire 1231 and the first sub-connection wire 122 is disposed under the sealant 300 of the corner area 305, and the distance between the junction and the outer edge 301 of the sealant is less than 60 um.

The junction of the second horizontal branch wire 1251 and the second sub-connection wire 122 is located under the sealant 300 in the corner area 305, and the distance between the junction and the outer edge 301 of the sealant is less than 60 um.

Because the signal lines can be arranged along the edge corners at the corners of the display panel 10, where the angle at the corners can be relatively larger, even 90°. However, for the position of the sealant 300, due to the influence of the gluing process, the corner of the sealant 300 cannot be 90° but an arc. Therefore, the signal lines in the corner area 305 are relatively closer to the frame outside the sealant 301, and even beyond the coverage area of the sealant 300. When it again comes to the linear area 304, however, the signal lines return to the coverage area of the sealant 300 again. Therefore, the junction of the sub-wire 112 and the connecting wire may be located outside the sealant 300 or at the corner area 305 of the sealant 300, while the junction of the first sub-wire 112 on the outer side and the first sub-connection wire 122 may be located outside the sealant 300. However, by moving the transition bridging structure 135 moved toward the linear area 304 of the sealant 300 through the branch wire 123, the length of the transition bridging structure 135 from the outer edge 301 of the sealant can be made greater than 60 um.

In particular, the sub-wire 112 corresponding to the transition hole is a ground wire or a low-level wire. That is, the sub-wire 112 corresponding to the outermost bridging structure 131 is a ground wire or a low-level wire. The ground wire and the low-level wire do not have high requirements for signal transmission. Thus, adding a branch wire 123 on the ground wire has little impact on the transmission signal, and it is suitable to use the branch wire 123 for transfer.

In particular, the projection of the first branch wire 124 on the first metal layer 110 does not coincide with the sub-wire 112, and the branch wire 123 is formed on the second metal layer 120. If they coincide, a large capacitance will be produced, which will affect the signal transmission on the sub-wire 112. In terms of projection, the configuration between the two sub-wires 112 can reduce capacitive crosstalk, without affecting the signal transmission on the sub-wires 112.

Figure 8:
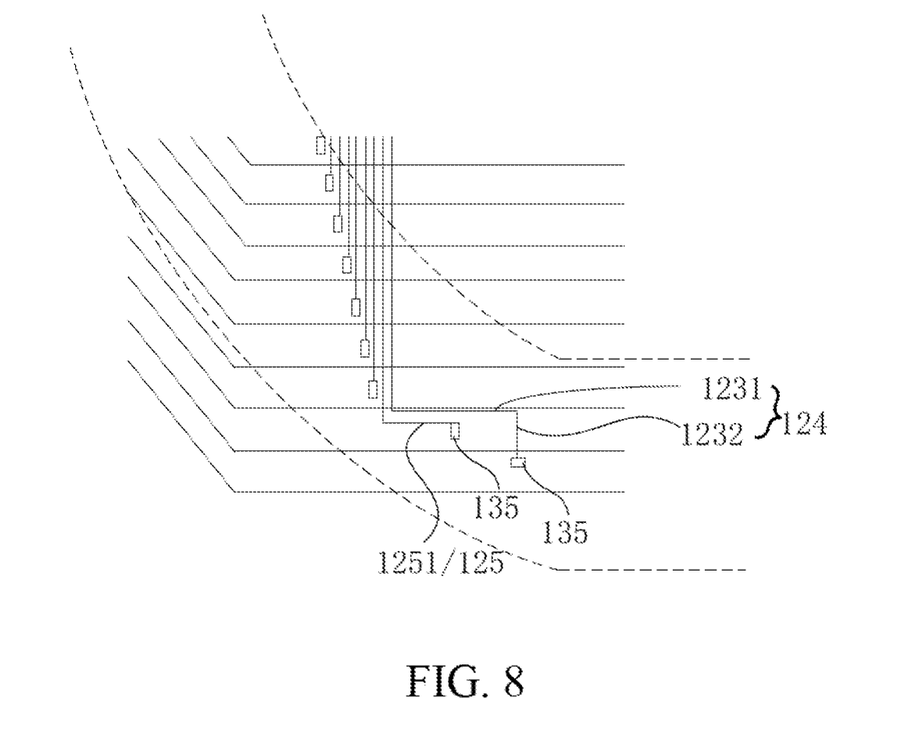
FIG. 8 is a schematic diagram illustrating the positions of a bridging structure and a sealant according to yet another embodiment of the present application.

This application also discloses another structure of the branch wire 123. In particular, the first horizontal branch wire 1231 is correspondingly disposed under the sealant 300 in the corner area 305, and the first vertical branch wire 1232 is disposed under the sealant 300 in the linear area 304. The first bridging structure 130 is disposed under the sealant 300 of the linear area 304, and the second bridging structure 130 is disposed under the sealant 300 of the corner area 305. The corner area 305 is provided with the first branch wire 124, and the first branch wire 124 is not provided beyond the corner area 305 to prevent the first branch wire 124 from being too long and increasing the impedance.

Figure 9:
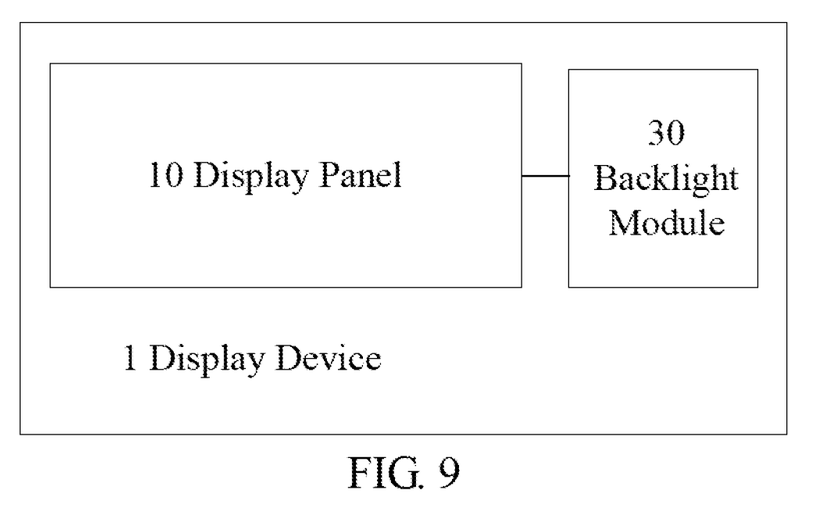
FIG. 9 is a schematic diagram of a display device according to another embodiment of the present application.

As another embodiment of the present application, the present application discloses a display device 1. The display device 1 includes a display panel 10 and a backlight module 30. The display panel 10 is divided into a display area 11 and a non-display area 12, including: an array substrate 101, and a color filter substrate 201 arranged opposite to the array substrate 101. A sealant 300 is disposed between the array substrate 101 and the color filter substrate 201, and the sealant 300 is disposed in the non-display area 12.

The array substrate 101 includes a substrate 170, a first metal layer 110, a first insulating layer 150, a second metal layer 120, a second insulating layer 160, and a conductive layer 140 that are stacked in sequence corresponding to the non-display area 12. In the first metal layer 110 is formed n sub-wires 112, and in the second metal layer 120 is formed n sub-connection wires 122 and at least one branch wire 123. A group of bridging structures 130 are arranged in one-to-one correspondence between the plurality of sub-wires 112 and the plurality of sub-connection wires 122. The conductive layer 140 is connected to the sub-wire 112 and the sub-connection wire 122 through the corresponding bridging structure 130. The bridging structure 130 is disposed on the sub-wire 112.

Of the n sub-wires 112, the one closest to the outer edge 301 of the sealant is the first sub-wire 112, and in the order of nearing the display area 11 from the position closest to the outer edge 301 of the sealant, the sub-wires 112 are sequentially the first sub-wire, the second sub-wire, . . . and the n-th sub-wire. Of the n sub-connection wires, the ones connected to the first sub-wire, the second sub-wire, . . . , and the n-th sub-wire are respectively the first sub-connection wire, the second sub-connection wire, . . . , and the n-th sub-connection wire. The bridging structures connecting the first sub-wires and the first sub-connection wires are the first bridging structures, which in turn are the second bridging structure, . . . , and the n-th bridging structure.

The branch wire 123 includes a first branch wire 124 and a second branch wire 125. The first branch wire 124 includes a first horizontal branch wire 1231 and a first vertical branch wire 1232, and the second branch wire 125 includes a second horizontal branch wire 1251. The first horizontal branch wire 1231 is perpendicular to the first vertical branch wire 1232. The first horizontal branch wire 1231 is parallel to the second horizontal branch wire 1251. The first bridging structure 130 is disposed on the first vertical branch wire 1232, and the first bridging structure 130 connects the first vertical branch wire 1232 with the first sub-wire 112. The first vertical branch wire 1232 is sequentially connected to the first horizontal branch wire 1231 with the first sub-connection wire 122. The second bridging structure 130 is disposed on the second horizontal branch wire 1251, and the second bridging structure 130 connects the second horizontal branch wire 1251 with the second sub-wire 112. The second horizontal branch wire 1251 is connected to the second sub-connection wire 122.

The sealant 300 is in the shape of an annular square or rectangle, and can be divided into a linear area 304 and a corner area 305. The linear area 304 includes a first linear area 304 parallel to the first direction 21 and a second linear area 304 parallel to the second direction 22. The first linear area 304 and the second linear area 304 are connected by a corner area 305. The sealant 300 in each of the first linear area 304 and the second linear area 304 is a linear segment, and the sealant 300 in the corner area 305 is a curved segment.

The junction of the first horizontal branch wire 1231 and the first sub-connection wire 122 is disposed under the sealant 300 of the corner area 305, and the distance between the junction and the outer edge 301 of the sealant is less than 60 um.

The junction of the second horizontal branch wire 1251 and the second sub-connection wire 122 is located under the sealant 300 in the corner area 305, and the distance between the junction and the outer edge 301 of the sealant is less than 60 um. The first bridging structure 130 is disposed under the sealant 300 of the linear region 304. The distance between each of all the bridging structures 130 and the outer edge 301 of the sealant is at least 60 um.

Different from the above-discussed embodiments, the present application further discloses another embodiment. In particular, in order to make the distance between the outermost bridging structure 131 and the outer edge 301 of the sealant meet the condition of 60 um without using the branch wire 123 to adjust the distance between the outermost bridging structure 131 and the outer edge 301 of the sealant, this embodiment first sets the via hole and then adjusts the coating of the sealant 300 depending on the position of the via hole, thus changing the coating distance for adjustment in order that the bridging structures 130 all meet the condition of being 60 um from the outside of the sealant.

The technical solutions of the present application may be widely used in various display panels, such as TN (Twisted Nematic) display panels, IPS (In-Plane Switching) display panels, VA (Vertical Alignment) display panels, and MVA (Multi-Domain Vertical Alignment) display panels. Of course, the above solutions are also applicable to other types of display panels, such as OLED (Organic Light-Emitting Diode) display panels.

The foregoing is a further detailed description of the present application in conjunction with specific optional embodiments, but it should not be construed as that the specific implementation of the present application will be limited to these descriptions. For those having ordinary skill in the technical field of the present application, without departing from the scope and spirit of the present application, some simple deductions or substitutions can be made, which should all be regarded as falling in the scope of protection of the present application.

What is claimed is:

1. A display panel, divided into a display area and a non-display area, the display panel comprising:
    a first substrate;
    a second substrate, disposed corresponding to the first substrate; and
    a sealant, arranged between the first substrate and the second substrate, and arranged in the non-display area;
    wherein the first substrate comprises a first metal layer and a second metal layer that are arranged in sequence corresponding to the non-display area, and that are insulated from each other; wherein the first substrate further comprises a first insulating layer that is disposed between the first metal layer and the second metal layer and that is configured to insulate the first metal layer and the second metal layer from each other;
    wherein the first metal layer comprises a first metal wire group, and the second metal layer comprises a second metal wire group; the first metal wire group comprises at least one sub-wire, the second metal wire group comprises at least one sub-connection wire; the at least one sub-wire of the first metal wire group and the at least one sub-connection wire of the second metal wire group are connected in one-to-one correspondence through a set of bridging structures, wherein the set of bridging structures comprises at least one bridging structure and are disposed within an outer edge of the sealant;
    wherein a side of the sealant adjacent to the display area is an inner side of the sealant, and a side of the sealant far away from the display area is an outer side of the sealant;
    wherein the set bridging structures are each disposed on a side of the outer edge of the sealant adjacent to the display area;
    wherein of the set of bridging structures, a bridging structure closest to the outer edge of the sealant is an outermost bridging structure, and wherein a distance separating the outermost bridging structure from the outer edge of the sealant is at least 50 um;
    wherein the second metal wire group further comprises at least one branch wire;
    wherein the set of bridging structures comprises at least one direct-connecting bridging structure and at least one transition bridging structure;
    wherein the at least one direct-connecting bridging structure is disposed on a respective sub-connection wire, and directly connects a respective sub-wire with the respective sub-connection wire;
    wherein the at least one transition bridging structure is arranged on the at least one branch wire in one-to-one correspondence, and connects a respective branch wire with a respective sub-wire; wherein each of the at least one branch wire is connected to a respective sub-connection wire; and wherein a number of the at least one transition bridging structure is equal to a number of the at least one branch wire;
    wherein a routing direction of each of the at least one branch wire is not parallel to a routing direction of the respective sub-connection wire, and wherein each of the at least one branch wire and the respective sub-connection wire are arranged in a same layer and are connected to each other;
    wherein a distance between the at least one direct-connecting bridging structure and the outer edge of the sealant is at least 60 um, and wherein a distance between the at least one transition bridging structure and the outer edge of the sealant is at least 60 um;
    wherein the outermost bridging structure is the transition bridging structure, and the sub-wire closest to the outer edge of the sealant is a first sub-wire.

2. The display panel of claim 1, wherein a distance between the outermost bridging structure and the outer edge of the sealant is 60-200 um.

3. The display panel of claim 1, wherein two adjacent edges of the first substrate extend along a first direction and a second direction, respectively, the first direction and the second direction being perpendicular to each other; wherein a routing direction of the first metal wire group is parallel to the first direction, and a routing direction of the second metal wire group is parallel to the second direction;
    wherein the sealant is in the shape of an annular square or rectangle and is divided into a linear area and a corner area, wherein the linear area comprises a first linear area parallel to the first direction and a second linear area parallel to the second direction, and wherein the first linear area and the second linear area are connected by the corner area;
    wherein a portion of the sealant in each of the first linear area and the second linear area is a linear segment, and wherein a portion of the sealant in the corner area is a curved segment;
    wherein some of the set of bridging structures are disposed under the portion of the sealant disposed in the corner area;
    wherein a junction of at least one branch wire and the respective sub-connection wire is disposed under the sealant in the corner area, and wherein a distance separating the junction of the at least one branch wire and the respective sub-connection wire from the outer edge of the sealant is less than 60 um.

4. The display panel of claim 3, wherein the at least one branch wire comprises a first horizontal branch wire parallel to the first direction and a first vertical branch wire parallel to the second direction; wherein the first horizontal branch wire and the first vertical branch wire are connected to each other, and are perpendicular to each other;
    wherein a respective transition bridging structure is arranged on the first vertical branch wire, and connects the first vertical branch wire with the sub-wire; the first vertical branch wire is sequentially connected to the first horizontal branch wire and the sub-connection wire;

wherein a junction of the first horizontal branch wire and the sub-connection wire is disposed under the sealant in the corner area, and a distance separating a junction of the first horizontal branch wire and the sub-connection wire from the outer edge of the sealant is less than 60 um.

5. The display panel of claim 3, wherein the first metal wire group comprises a number of n parallel sub-wires, and the second metal wire group comprises a number of n parallel sub-connection wires and two branch wires;

wherein of the n sub-wires, the sub-wire closest to the outer edge of the sealant is a first sub-wire, and in a direction of nearing the display area from the outer side of the sealant, the n sub-wires sequentially arranged are the first sub-wire, a second sub-wire, . . . , and a nth sub-wire;

wherein of the n sub-connection wires, the ones respectively connected to the first sub-wire, the second sub-wire, . . . , and the n-th sub-wire are respectively a first sub-connection wire, a second sub-connection wire, . . . , and an n-th sub-connection wire;

wherein the bridging structure connecting the first sub-wire with the first sub-connection wire is a first bridging structure, . . . , the bridging structure connecting the n-th sub-wire and the n-th sub-connection wire is an n-th bridging structure;

wherein the first bridging structure and the second bridging structure are each the transition bridging structure; the third bridging structure, the fourth bridging structure, and the nth bridging structure are each the direct-connecting bridging structure;

wherein the branch wire corresponding to the first bridging structure is a first branch wire, and the branch wire corresponding to the second bridging structure is a second branch wire; the first branch wire includes a first horizontal branch wire and a first vertical branch wire, and the second branch wire includes a second horizontal branch wire; the first horizontal branch wire is perpendicular to the first vertical branch wire, and the first horizontal branch wire is parallel to the second horizontal branch wire;

wherein the first bridging structure is arranged on the first vertical branch wire, and connects the first vertical branch wire with the first sub-wire; the first vertical branch wire is sequentially connected to the first horizontal branch wire and the first sub-connection wire;

wherein the second bridging structure is disposed on the second horizontal branch wire, and connects the second horizontal branch wire with the second sub-wire; wherein the second horizontal branch wire is connected to the second sub-connection wire;

wherein junction of the first horizontal branch wire and the first sub-connection wire is disposed under the sealant of the corner area, and wherein a distance separating the junction of the first horizontal branch wire and the first sub-connection wire from the outer edge of the sealant is less than 60 um;

wherein a junction of the second horizontal branch wire and the second sub-connection wire is disposed under the sealant of the corner area, and wherein a distance separating the junction of the second horizontal branch wire and the second sub-connection wire from the outer edge of the sealant is less than 60 um.

6. The display panel of claim 1, wherein a projection of each of the at least one branch wire onto the first metal layer does not coincide with a projection of the respective sub-wire onto the first metal layer.

7. The display panel of claim 1, wherein a distance separating the outermost bridging structure and an adjacent bridging structure is greater than or equal to 20 um.

8. The display panel of claim 1, wherein a distance between adjacent bridging structures is greater than or equal to 20 um.

9. The display panel of claim 1, wherein the at least one sub-wire is a peripheral wire disposed in the non-display area, and is configured to provide a driving signal voltage for the display panel, and wherein the at least one sub-connection wire is an electrostatic discharge wire.

10. A display panel, divided into a display area and a non-display area, the display panel comprising:

an array substrate, a color filter substrate, arranged opposite to the array substrate;

a sealant, arranged between the array substrate and the color filter substrate, and arranged in the non-display area;

wherein the array substrate comprises a substrate, a first metal layer, a first insulating layer, a second metal layer, a second insulating layer, and a conductive layer that are stacked in sequence corresponding to the non-display area;

wherein two adjacent edges of the first substrate extend along a first direction and a second direction, respectively, the first direction and the second direction being perpendicular to each other;

wherein the first metal layer comprises a first metal wire group, and the second metal layer comprises a second metal wire group;

wherein a routing direction of the first metal wire group is parallel to the first direction, and a routing direction of the second metal wire group is parallel to the second direction;

wherein the first metal wire group comprises a plurality of n sub-wires, and the second metal wire group comprises a plurality of n sub-connection wires and at least one branch wire;

wherein a set of bridging structures is arranged in one-to-one correspondence between the plurality of sub-wires and the plurality of sub-connection wires; the conductive layer connects the sub-wires and respective sub-connection wires through corresponding bridging structures;

wherein each of the set of bridging structures is arranged on a respective sub-wire;

wherein of the n sub-wires, the sub-wire closest to the outer edge of the sealant is a first sub-wire, and in a direction of nearing the display area from the outer side of the sealant, the n sub-wires sequentially arranged are the first sub-wire, a second sub-wire, . . . , and an nth sub-wire;

wherein of the n sub-connection wires, the ones respectively connected to the first sub-wire, the second sub-wire, . . . , and the n-th sub-wire are respectively a first sub-connection wire, a second sub-connection wire, . . . , and an n-th sub-connection wire;

wherein a bridging structure connecting the first sub-wire with the first sub-connection wire is a first bridging structure, . . . , and a bridging structure connecting the n-th sub-wire with the n-th sub-connection wire is an n-th bridging structure;

wherein the at least one branch wire comprises a first branch wire and a second branch wire, wherein the first branch wire comprises a first horizontal branch wire parallel to the first direction and a first vertical branch wire parallel to the second direction, wherein the first horizontal branch wire and the first vertical branch wire are connected to each other; wherein the second branch wire comprises a second horizontal branch wire parallel to the first direction, the first horizontal branch wire is perpendicular to the first vertical branch wire, and the first horizontal branch wire is parallel to the second horizontal branch wire;

wherein the first bridging structure is arranged on the first vertical branch wire, and connects the first vertical branch wire with the first sub-wire; the first vertical branch wire is sequentially connected to the first horizontal branch wire and the first sub-connection wire;

wherein the second bridging structure is disposed on the second horizontal branch wire, and connects the second horizontal branch wire with the second sub-wire, and wherein the second horizontal branch wire is connected to the second sub-connection wire;

wherein the sealant is in the shape of an annular square or rectangle and is divided into a linear area and a corner area, wherein the linear area includes a first linear area parallel to the first direction and a second linear area parallel to the second direction, and wherein the first linear area and the second linear area are connected by the corner area;

wherein a portion of the sealant in each of the first linear area and the second linear area is a linear segment, and wherein a portion of the sealant in the corner area is a curved segment;

wherein a junction of the first horizontal branch wire and the first sub-connection wire is disposed under the sealant in the corner area, and a distance separating the junction of the first horizontal branch wire and the first sub-connection wire from the outer edge of the sealant is less than 60 um; wherein a junction of the second horizontal branch wire and the second sub-connection wire is disposed under the sealant in the corner area, and a distance separating the junction of the second horizontal branch wire and the second sub-connection wire from the outer edge of the sealant is less than 60 um;

wherein the first bridging structure is disposed under the portion of the sealant disposed in the corner area;

wherein the distance separating each of all the set of bridging structures from the outer edge of the sealant is at least 60 um.

11. A display device, comprising a display panel and a backlight module configured to provide a light source for the display panel, the display panel comprising:

a first substrate, and a second substrate, disposed corresponding to the first substrate;

a sealant, arranged between the first substrate and the second substrate, and arranged in a non-display area of the display panel;

wherein the first substrate comprises a first metal layer and a second metal layer that are arranged in sequence corresponding to the non-display area, and wherein the first metal layer and the second metal layer are insulated from each other; wherein the first substrate further comprises a first insulating layer that is disposed between the first metal layer and the second metal layer and that is configured to insulate the first metal layer and the second metal layer from each other;

wherein the first metal layer comprises a first metal wire group, and the second metal layer comprises a second metal wire group; the first metal wire group comprises at least one sub-wire, the second metal wire group comprises at least one sub-connection wire; the at least one sub-wire of the first metal wire group and the at least one sub-connection wire of the second metal wire group are connected in one-to-one correspondence through a set of bridging structures, wherein the set of bridging structures comprises at least one bridging structure and are disposed within an outer edge of the sealant;

wherein a side of the sealant adjacent to a display area of the display panel is an inner side of the sealant, and a side of the sealant far away from the display area is an outer side of the sealant;

wherein the set bridging structures are each disposed on a side of the outer edge of the sealant adjacent to the display area;

wherein of the set of bridging structures, a bridging structure closest to the outer edge of the sealant is an outermost bridging structure, and wherein a distance separating the outermost bridging structure from the outer edge of the sealant is at least 50 um;

wherein the second metal wire group further comprises at least one branch wire;

wherein the set of bridging structures comprises at least one direct-connecting bridging structure and at least one transition bridging structure;

wherein the at least one direct-connecting bridging structure is disposed on a respective sub-connection wire, and directly connects a respective sub-wire with the respective sub-connection wire;

the at least one transition bridging structure is arranged on the at least one branch wire in one-to-one correspondence, and connects a respective branch wire with a respective sub-wire; wherein each of the at least one branch wire is connected to a respective sub-connection wire; and wherein a number of the at least one transition bridging structure is equal to a number of the at least one branch wire;

wherein a routing direction of each of the at least one branch wire is not parallel to a routing direction of the respective sub-connection wire, and wherein each of the at least one branch wire and the respective sub-connection wire are arranged in a same layer and are connected to each other;

wherein a distance between the at least one direct-connecting bridging structure and the outer edge of the sealant is at least 60 um, and wherein a distance between the at least one transition bridging structure and the outer edge of the sealant is at least 60 um;

wherein the outermost bridging structure is the transition bridging structure, and the sub-wire closest to the outer edge of the sealant is a first sub-wire.

12. The display device of claim 11, wherein a distance between the outermost bridging structure and an outer edge of the sealant is 60-200 um.

13. The display device of claim 11, wherein two adjacent edges of the first substrate extend along a first direction and a second direction, respectively, wherein the first direction and the second direction are perpendicular to each other; wherein a routing direction of the first metal wire group is parallel to the first direction, and a routing direction of the second metal wire group is parallel to the second direction;

wherein the sealant is in the shape of an annular square or rectangle and is divided into a linear area and a corner area, wherein the linear area includes a first linear area parallel to the first direction and a second linear area parallel to the second direction, and wherein the first linear area and the second linear area are connected by the corner area;

wherein a portion of the sealant in each of the first linear area and the second linear area is a linear segment, and wherein a portion of the sealant in the corner area is a curved segment;

wherein one or more of the set of bridging structures are disposed under the portion of the sealant disposed in the corner area;

wherein a junction of the at least one branch wire and the respective sub-connection wire is disposed under the sealant in the corner area, and wherein a distance separating the junction of the at least one branch wire and the respective sub-connection wire from the outer edge of the sealant is less than 60 um.

14. The display device of claim 13, wherein the at least one branch wire comprises a first horizontal branch wire parallel to the first direction and a first vertical branch wire parallel to the second direction; wherein the first horizontal branch wire and the first vertical branch wire are connected to each other, and are perpendicular to each other;

wherein the respective transition bridging structure is arranged on the first vertical branch wire, and connects the first vertical branch wire with the sub-wire; the first vertical branch wire is sequentially connected to the first horizontal branch wire and the sub-connection wire;

wherein a junction of the first horizontal branch wire and the sub-connection wire is disposed under the sealant in the corner area, and a distance separating a junction of the first horizontal branch wire and the sub-connection wire from the outer edge of the sealant is less than 60 um.

* * * * *